US011612074B2

(12) United States Patent
Liao et al.

(10) Patent No.: US 11,612,074 B2
(45) Date of Patent: Mar. 21, 2023

(54) WATERPROOFING STRUCTURE AND RELATED ELECTRONIC DEVICE

(71) Applicant: Wistron Corporation, New Taipei (TW)

(72) Inventors: Ji-Cheng Liao, New Taipei (TW); Chang-Feng Lan, New Taipei (TW); Hung-Sen Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/888,840

(22) Filed: May 31, 2020

(65) Prior Publication Data

US 2021/0259125 A1  Aug. 19, 2021

(30) Foreign Application Priority Data

Feb. 13, 2020 (TW) ................................. 109104460

(51) Int. Cl.
*H05K 5/06* (2006.01)
*H04B 1/3888* (2015.01)

(52) U.S. Cl.
CPC ........... *H05K 5/063* (2013.01); *H04B 1/3888* (2013.01); *H05K 5/069* (2013.01)

(58) Field of Classification Search
CPC .................................................. G06F 1/1634
See application file for complete search history.

(56) References Cited

U.S. PATENT DOCUMENTS

2016/0282903 A1* 9/2016 Lan ...................... G06F 1/1632
2020/0303693 A1* 9/2020 Zhang ................... H01M 50/20

FOREIGN PATENT DOCUMENTS

CN  103970191 A  8/2014
CN  106502083 A  3/2017

* cited by examiner

*Primary Examiner* — Jerry Wu
(74) *Attorney, Agent, or Firm* — Winston Hsu

(57) ABSTRACT

A waterproofing structure is disposed between a first assembling component and a second assembling component of an electronic device. The second assembling component is detachably installed on the first assembling component. The waterproofing structure includes a sealing component, an abutting component and a sliding component. The sealing component is located between the first assembling component and the second assembling component. The abutting component is fixed on the second assembling component. The sliding component is slidably installed on the first assembling component. When the sliding component slides along a first direction, the sliding component forces the abutting component to drive the second assembling component to move toward the first assembling component, so that the sealing component is pressed by the first assembling component and the second assembling component.

18 Claims, 10 Drawing Sheets

WATERPROOFING STRUCTURE AND RELATED ELECTRONIC DEVICE

BACKGROUND OF THE DISCLOSURE

1. Field of the Disclosure

The present disclosure relates to a waterproofing structure and a related electronic device, and more particularly, to a waterproofing structure with an enhanced waterproofing function and without affecting an external appearance of an electronic device, and a related electronic device having the aforementioned waterproofing structure.

2. Description of the Prior Art

With development of technology, various electronic devices are widely used to bring convenience in people's lives. In order to extend service life of electronic devices, most electronic devices are usually equipped with waterproofing structures for preventing internal electronic components from being damaged due to exposure to water. A conventional waterproofing structure utilizes a rubber ring that is disposed between two assembling components and clamped by the two assembling components when the two assembling components are fixed by screwing, to block water from entering into an internal space where the electronic components are disposed. However, such mechanism requires a screw boss disposed inside the electronic device for engaging with a screw and a through hole formed on an outer case of the electronic device for allowing the screw to pass through the through hole to engage with the screw boss. Therefore, it increases thickness of the electronic device and negatively affects an external appearance of the electronic device.

SUMMARY OF THE DISCLOSURE

Therefore, it is an objective of the present disclosure to provide a waterproofing structure with an enhanced waterproofing function and without affecting an external appearance of an electronic device, and a related electronic device having the aforementioned waterproofing structure.

In order to achieve the aforementioned objective, the present invention discloses a waterproofing structure disposed between a first assembling component and a second assembling component of an electronic device. The second assembling component is detachably installed on the first assembling component. The waterproofing structure includes a sealing component, at least one abutting component and at least one sliding component. The sealing component is located between the first assembling component and the second assembling component. The at least one abutting component is fixed on the second assembling component. The at least one sliding component is slidably installed on the first assembling component. When the at least one sliding component slides along a first direction, the at least one sliding component forces the abutting component to drive the second assembling component to move toward the first assembling component), so that the sealing component is pressed by the first assembling component and the second assembling component.

According to an embodiment of the present invention, the waterproofing structure further includes at least one fixing component. At least one through hole is formed on a fixing end of the at least one sliding component away from the at least one abutting component for allowing the at least one fixing component to pass through the at least one through hole. The at least one through hole is aligned with at least one fixing portion formed on the second assembling component when the at least one sliding component is located at an engaging position, and the at least one fixing component passes through the at least one through hole to fix the fixing end of the at least one sliding component onto the at least one fixing portion formed on the second assembling component when the at least one sliding component is located at the engaging position.

According to an embodiment of the present invention, the waterproofing structure further includes at least one fixing component. The at least one through hole is formed on a fixing end of the at least one sliding component away from the at least one abutting component for allowing the at least one fixing component to pass through the at least one through hole, and an engaging end of the at least one sliding component abutting against the at least one abutting component moves toward the first assembling component during a process that the at least one fixing component passes through the at least one through hole to fix the fixing end of the at least one sliding component onto the at least one fixing portion formed on the second assembling component.

According to an embodiment of the present invention, an operating portion protrudes from the at least one sliding component, and an inserting portion is formed on the first assembling component and located at a position corresponding to the operating portion.

According to an embodiment of the present invention, a first abutting surface is formed on an engaging end of the at least one sliding component for abutting against the at least one abutting component. A second abutting surface is formed on the at least one abutting component, and the first abutting surface abuts against the second abutting surface to drive the second assembling component to move toward the first assembling component along a second direction different from the first direction when the at least one sliding component slides along the first direction.

According to an embodiment of the present invention, the engaging end of the at least one sliding component includes a first engaging hook. The first abutting surface is formed on the first engaging hook. The at least one abutting component includes a second engaging hook. The second abutting surface is formed on the second engaging hook, and the second direction is substantially perpendicular to the first direction.

According to an embodiment of the present invention, the waterproofing structure further includes at least one guiding protrusion disposed on the at least one abutting component, and the at least one guiding protrusion includes a guiding inclined surface for driving the at least one sliding component to move along a third direction substantially opposite to the first direction.

According to an embodiment of the present invention, the sealing component is formed in an enclosed structure and made of resilient material. A waterproofing area is enclosed by the sealing component, and the at least one abutting component is located at a position corresponding to the sealing component and outside the waterproofing area.

According to an embodiment of the present invention, the at least one abutting component includes a plurality of abutting components. The plurality of abutting components are disposed outside and around the waterproofing area, and when the at least one sliding component slides along the first direction, the at least one sliding component forces the plurality of abutting components to drive the second assembling component to move toward the first assembling component, so that the sealing component is pressed by the first assembling component and the second assembling component.

According to an embodiment of the present invention, the at least one sliding component includes a plurality of sliding components corresponding to the plurality of abutting components, and when each of the plurality of sliding components slides along the first direction, each of the plurality of sliding components forces a corresponding one of the plurality of abutting components to drive the second assembling component to move toward the first assembling component, so that the sealing component is pressed by the first assembling component and the second assembling component.

In order to achieve the aforementioned objective, the present invention further discloses an electronic device with waterproofing function. The electronic device includes a first assembling component, a second assembling component and a waterproofing structure. The second assembling component is detachably installed on the first assembling component. The waterproofing structure is disposed between the first assembling component and the second assembling component. The waterproofing structure includes a sealing component, at least one abutting component and at least one sliding component. The sealing component is located between the first assembling component and the second assembling component. The at least one abutting component is fixed on the second assembling component. The at least one sliding component is slidably installed on the first assembling component. When the at least one sliding component slides along a first direction, the at least one sliding component forces the abutting component to drive the second assembling component to move toward the first assembling component, so that the sealing component is pressed by the first assembling component and the second assembling component.

According to an embodiment of the present invention, the waterproofing structure further includes at least one fixing component. At least one through hole is formed on a fixing end of the at least one sliding component away from the at least one abutting component for allowing the at least one fixing component to pass through the at least one through hole. The at least one through hole is aligned with at least one fixing portion formed on the second assembling component when the at least one sliding component is located at an engaging position, and the at least one fixing component passes through the at least one through hole to fix the fixing end of the at least one sliding component onto the at least one fixing portion formed on the second assembling component when the at least one sliding component is located at the engaging position.

According to an embodiment of the present invention, the waterproofing structure further includes at least one fixing component. At least one through hole is formed on a fixing end of the at least one sliding component away from the at least one abutting component for allowing the at least one fixing component to pass through the at least one through hole, and an engaging end of the at least one sliding component abutting against the at least one abutting component moves toward the first assembling component during a process that the at least one fixing component passes through the at least one through hole to fix the fixing end of the at least one sliding component onto the at least one fixing portion formed on the second assembling component.

According to an embodiment of the present invention, an operating portion protrudes from the at least one sliding component, and an inserting portion is formed on the first assembling component and located at a position corresponding to the operating portion.

According to an embodiment of the present invention, a first abutting surface is formed on an engaging end of the at least one sliding component for abutting against the at least one abutting component. A second abutting surface is formed on the at least one abutting component, and the first abutting surface abuts against the second abutting surface to drive the second assembling component to move toward the first assembling component along a second direction different from the first direction when the at least one sliding component slides along the first direction.

According to an embodiment of the present invention, the engaging end of the at least one sliding component includes a first engaging hook. The first abutting surface is formed on the first engaging hook. The at least one abutting component includes a second engaging hook. The second abutting surface is formed on the second engaging hook, and the second direction is substantially perpendicular to the first direction.

According to an embodiment of the present invention, the waterproofing structure further includes at least one guiding protrusion disposed on the at least one abutting component, and the at least one guiding protrusion includes a guiding inclined surface for driving the at least one sliding component to move along a third direction substantially opposite to the first direction.

According to an embodiment of the present invention, the sealing component is formed in an enclosed structure and made of resilient material. A waterproofing area is enclosed by the sealing component, and the at least one abutting component is located at a position corresponding to the sealing component and outside the waterproofing area.

According to an embodiment of the present invention, the at least one abutting component includes a plurality of abutting components. The plurality of abutting components are disposed outside and around the waterproofing area, and when the at least one sliding component slides along the first direction, the at least one sliding component forces the plurality of abutting components to drive the second assembling component to move toward the first assembling component, so that the sealing component is pressed by the first assembling component and the second assembling component.

According to an embodiment of the present invention, the at least one sliding component includes a plurality of sliding components corresponding to the plurality of abutting components, and when each of the plurality of sliding components slides along the first direction, each of the plurality of sliding components forces a corresponding one of the plurality of abutting components to drive the second assembling component to move toward the first assembling component, so that the sealing component is pressed by the first assembling component and the second assembling component.

In summary, the present disclosure utilizes relative sliding movement of the first abutting surface formed on the sliding component and the second abutting surface formed on the abutting component to drive the second assembling component to move toward the first assembling component, so that the sealing component disposed between the first assembling component and the second assembling component can be pressed by the first assembling component and the second assembling component to be resiliently deformed, which achieves a purpose of blocking liquid outside the waterproofing area enclosed by the sealing component to prevent the liquid from entering into an internal space where electronic components are disposed. Such mechanism does not require a screw boss and a through hole acknowledged in the prior art. Therefore, the electronic device of the present disclosure has thinner thickness and an improved external appearance.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
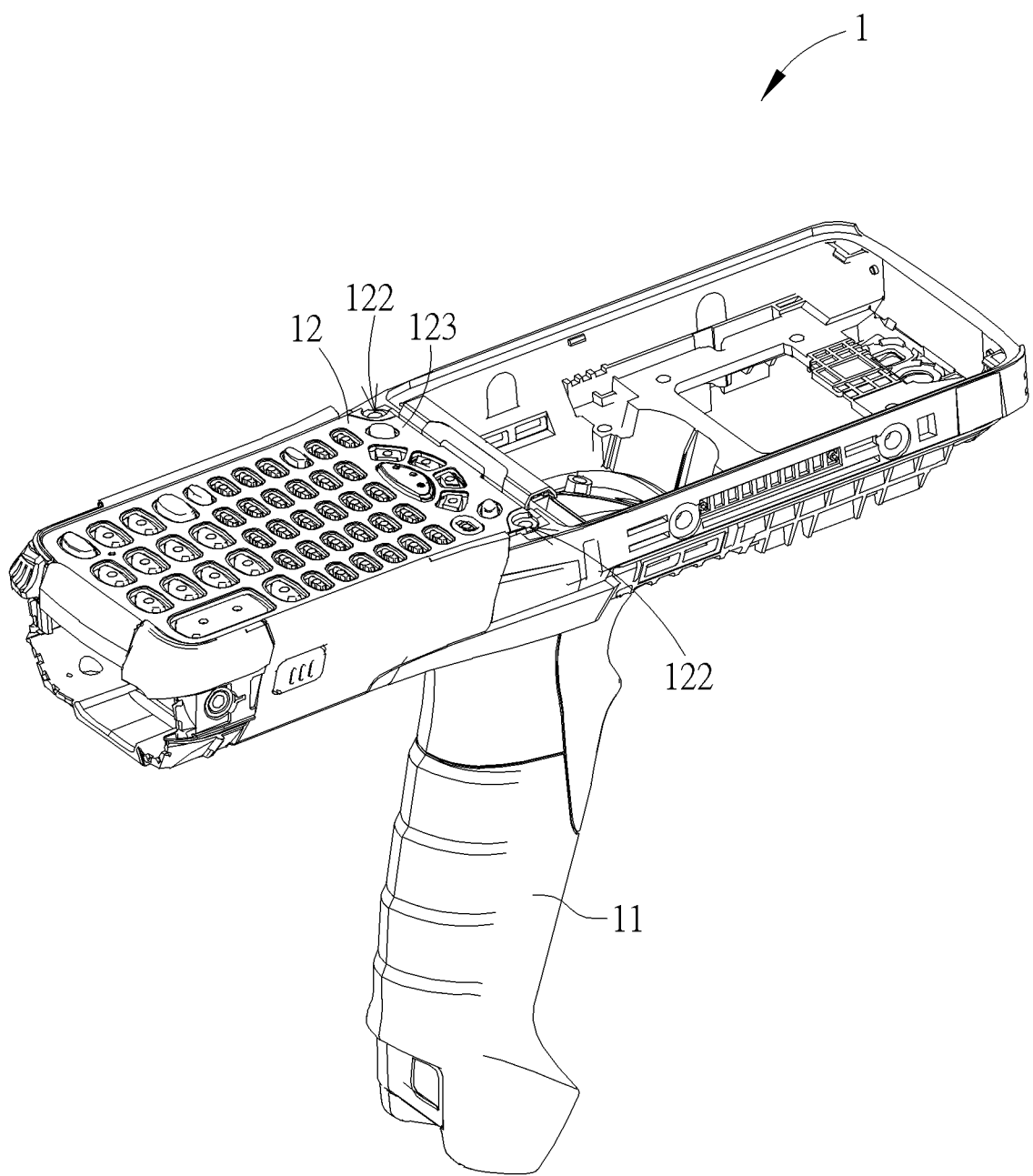
FIG. 1 and FIG. 2 are partial schematic diagrams of an electronic device at different views according to an embodiment of the present disclosure.
Figure 2:
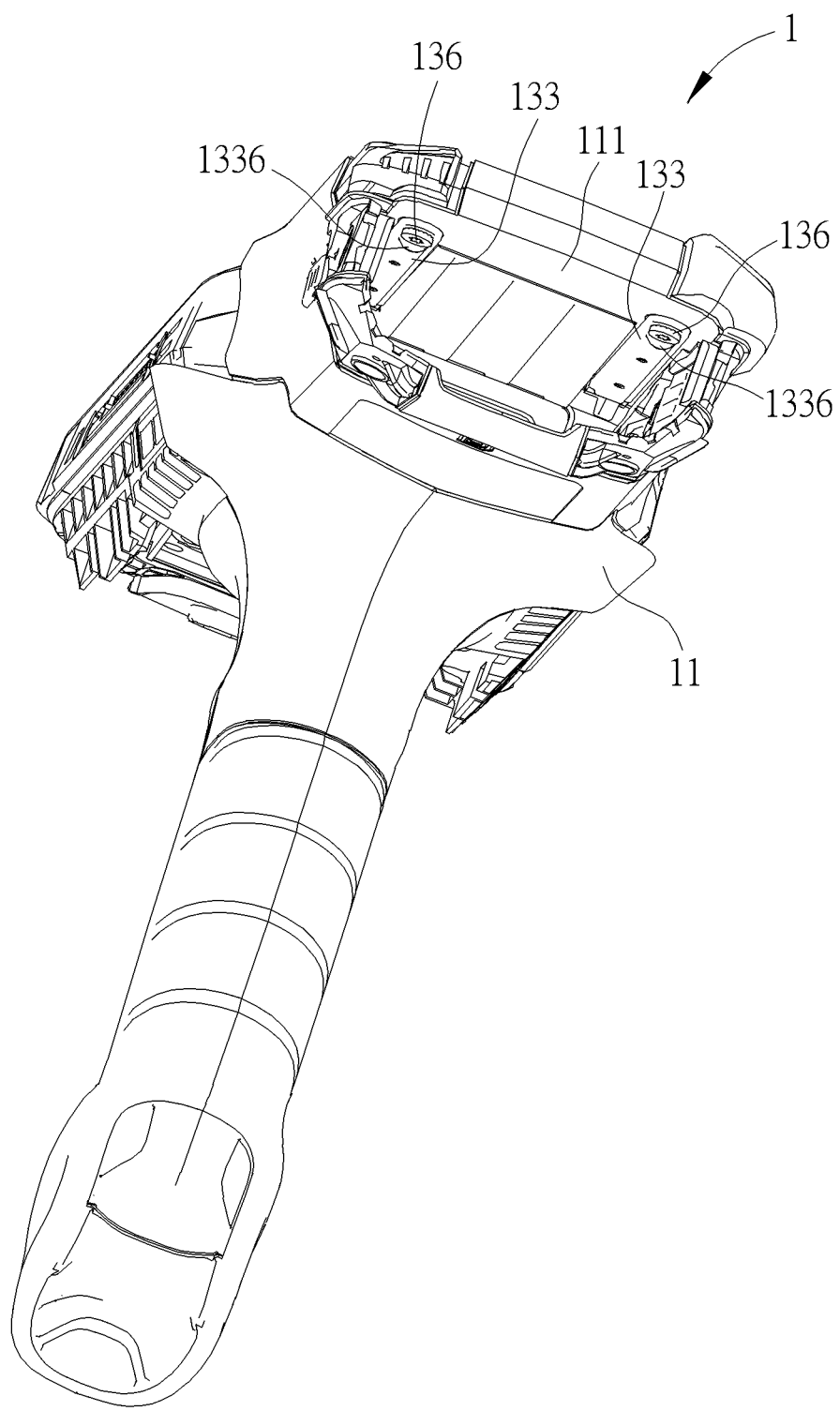
Figure 3:
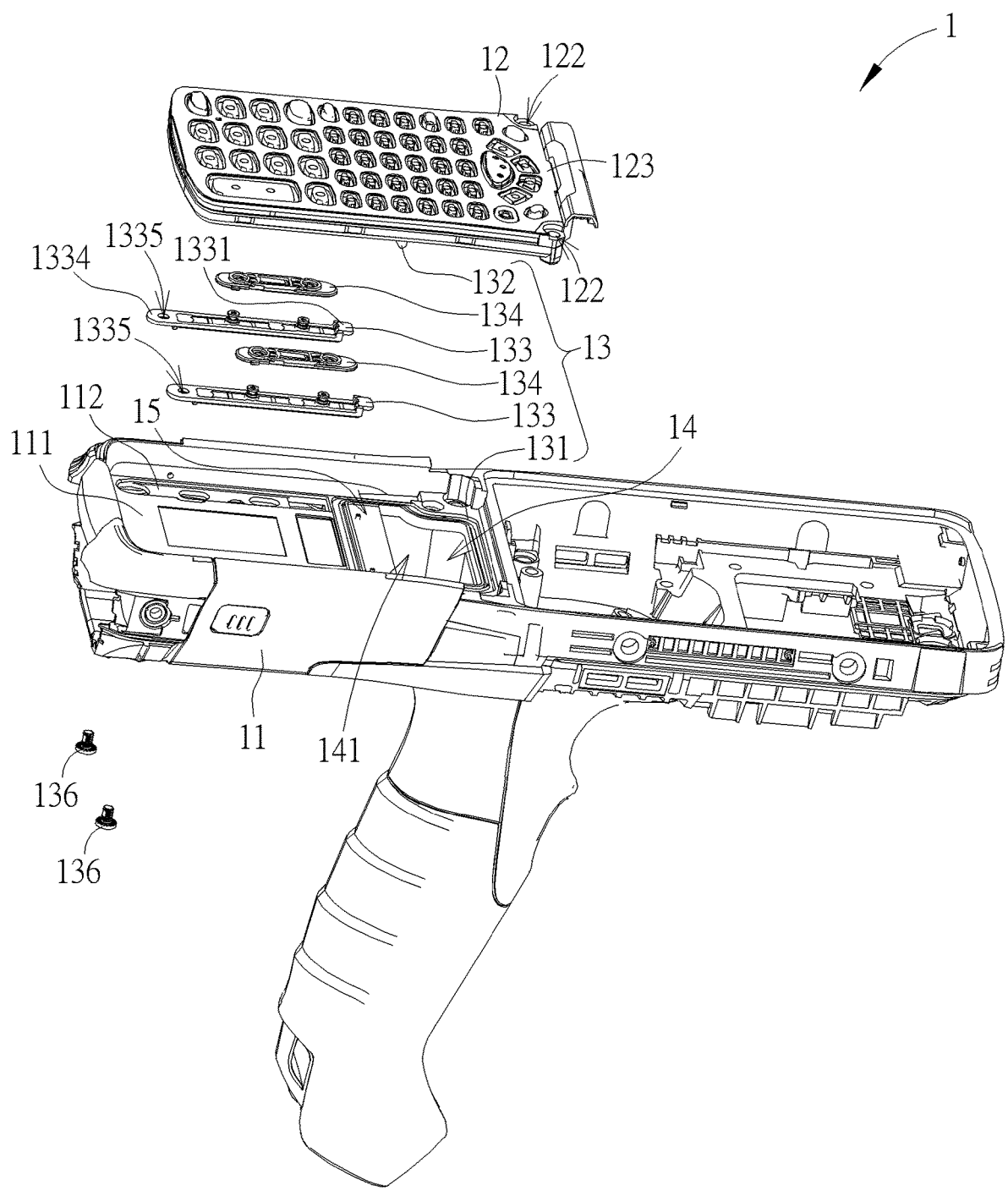
FIG. 3 to FIG. 5 are partial exploded diagrams of the electronic device at different views according to the embodiment of the present disclosure.
Figure 4:
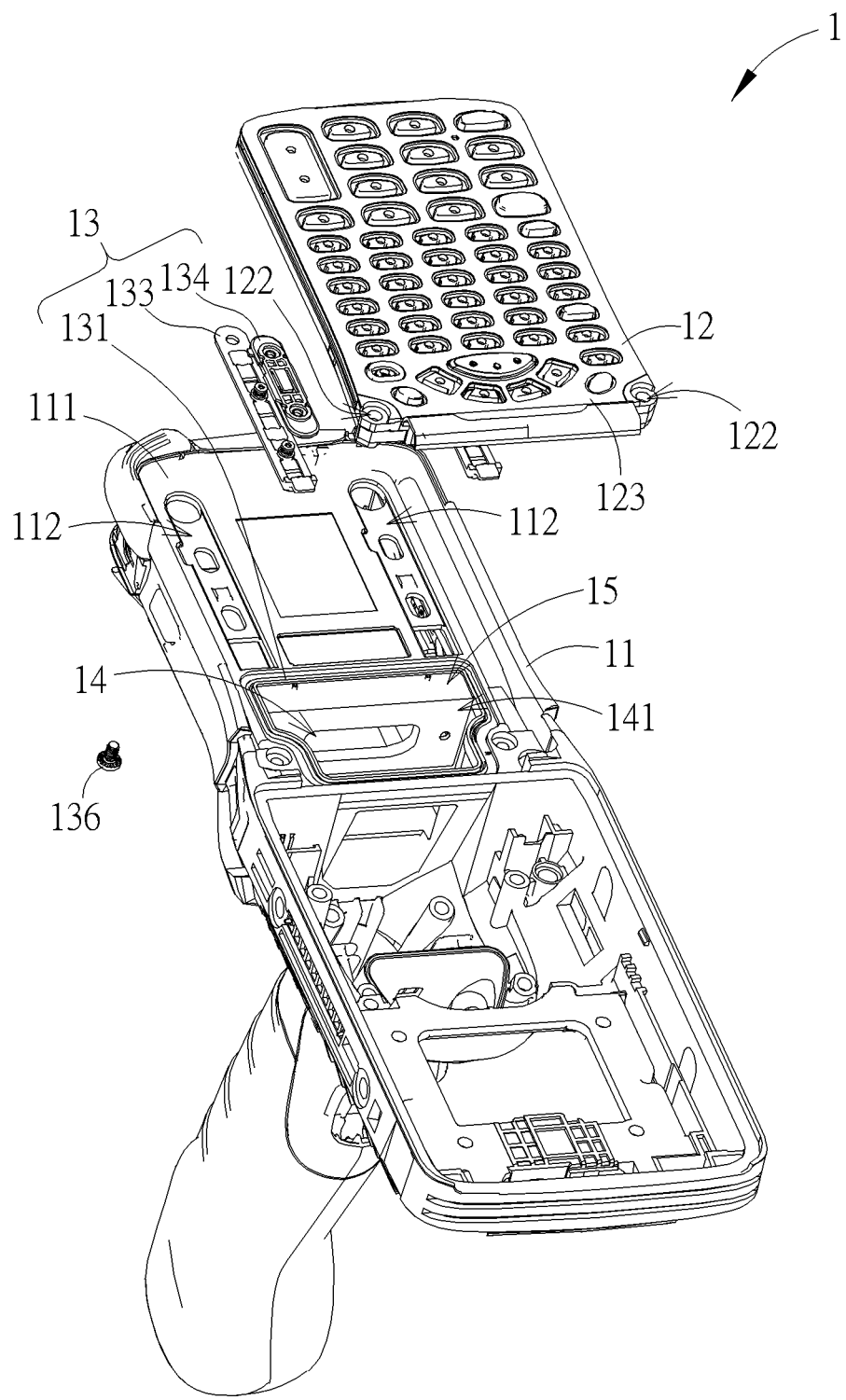
Figure 5:
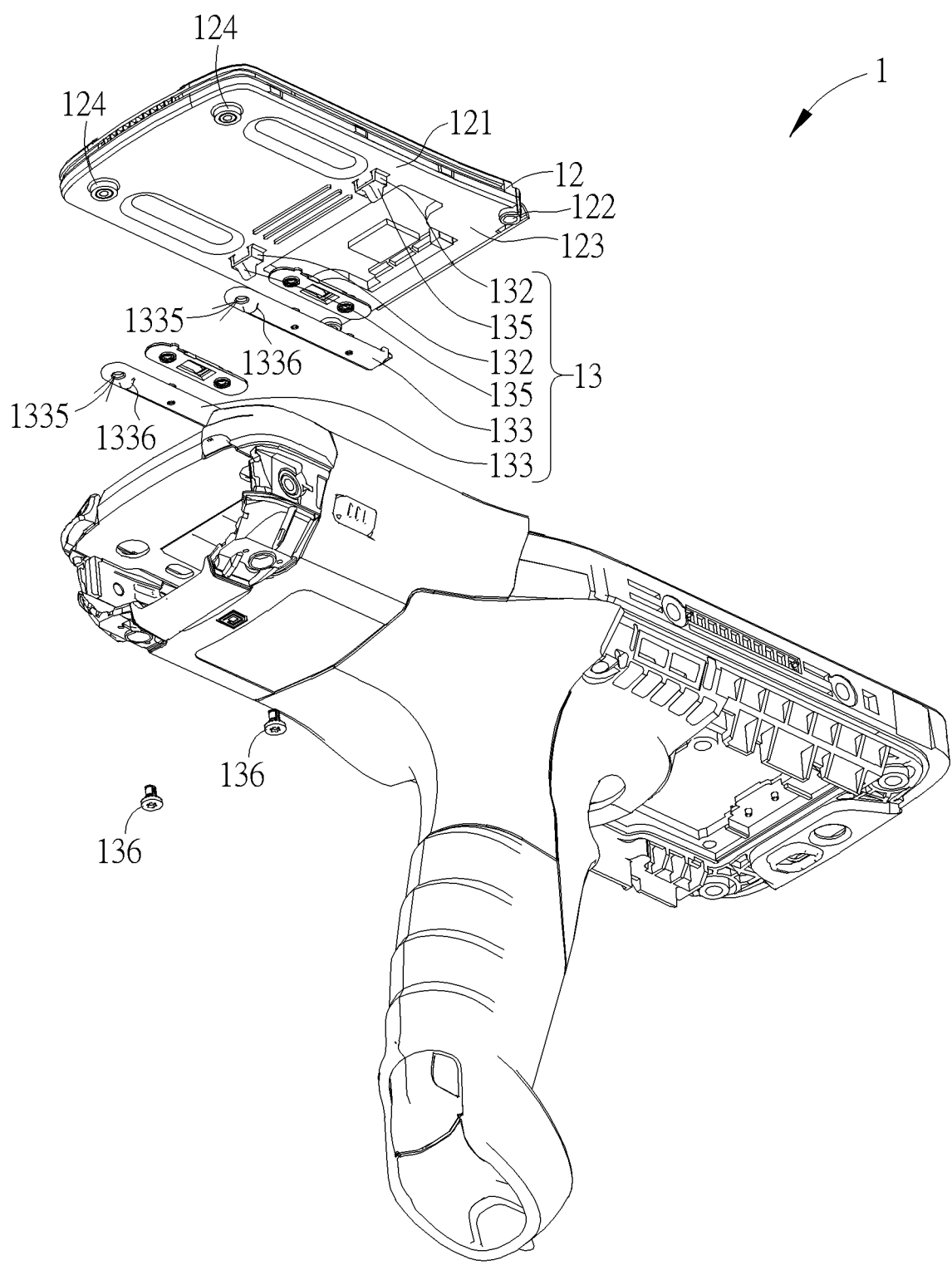

Please refer to FIG. 1 to FIG. 5. FIG. 1 and FIG. 2 are partial schematic diagrams of an electronic device 1 at different views according to an embodiment of the present disclosure. FIG. 3 to FIG. 5 are partial exploded diagrams of the electronic device 1 at different views according to the embodiment of the present disclosure. As shown in FIG. 1 to FIG. 5, the electronic device 1 includes a first assembling component 11, a second assembling component 12, a waterproofing structure 13 and a display module, which is not shown in the figures. The second assembling component 12 is detachably installed on the first assembling component 11. The waterproofing structure 13 is disposed between the first assembling component 11 and the second assembling component 12. The waterproofing structure 13 is for preventing liquid from entering into an internal space 14 inside the electronic device 1 where electronic components are disposed through a gap between the first assembling component 11 and the second assembling component 12. In this embodiment, the electronic device 1 can be a barcode scanning and inputting device, and the first assembling component 11 can be an outer case. Furthermore, the display module can be a monitor installed on the outer case, and the second assembling component 12 can be a keyboard installed on the outer case and beside the monitor. Besides, a user can replace the second assembling component 12 with another one having another keyboard layout according to practical demands. However, the present disclosure is not limited to this embodiment. For example, in another embodiment, the electronic device can be a keyboard device, and the first assembling component and the second assembling component can be respectively be a keyboard base and a detachable input module, e.g., a keypad, installed on the keyboard base.

Figure 6:
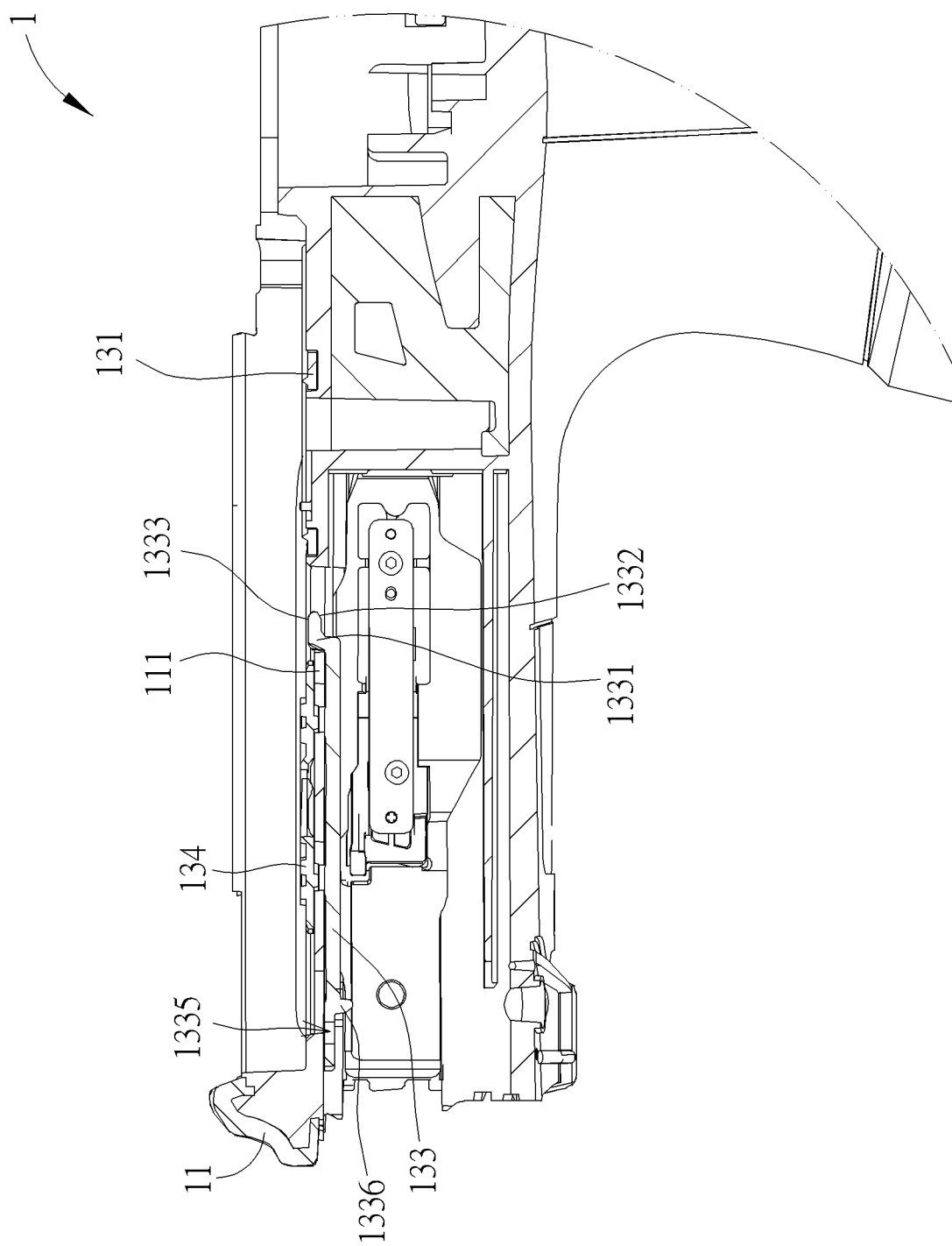
FIG. 6 is a partial internal structural diagram of the electronic device according to the embodiment of the present disclosure.

Please refer to FIG. 3 to FIG. 6. FIG. 6 is a partial internal structural diagram of the electronic device 1 according to the embodiment of the present disclosure. As shown in FIG. 3 to FIG. 6, the waterproofing structure 13 includes a sealing component 131, two abutting components 132 and two sliding components 133. The sealing component 131 is located between the first assembling component 11 and the second assembling component 12. The two abutting components 132 are fixed on the second assembling component 12. The two sliding components 133 are slidably installed on the first assembling component 11 and for respectively abutting against the two abutting components 132. When each sliding component 133 slides relative to the first assembling component 11, each sliding component 133 can abut against the corresponding abutting component 132 to drive the second assembling component 12 to move toward the first assembling component 11, so that the sealing component 131 can be pressed by the first assembling component 11 and the second assembling component 12 for preventing the liquid from entering into the internal space 14 to avoid a short circuit or damage of any of the electronic components in the internal space 14.

Preferably, in this embodiment, the sealing component 131 can be an enclosed structure and made of resilient material. A waterproofing area 15 is enclosed by the sealing component 131. The waterproofing area 15 is located at an opening 141 communicated with the internal space 14. The two abutting components 132 are located at positions corresponding to the sealing component 131 and outside the waterproofing area 15. The two sliding components 133 are slidably installed on the first assembling component 11 and for respectively forcing the two abutting components 132 to drive the two assembling components 12. When each sliding component 133 slides relative to the first assembling component 11, each sliding component 133 can force the corresponding abutting component 132 to drive the second assembling component 12 to move toward the first assembling component 11, so that the sealing component 131 can be pressed by the first assembling component 11 and the second assembling component 12 to be resiliently deformed for blocking the liquid outside the waterproofing area 15 to prevent the liquid from entering into the internal space 14 via the opening 141, so as to avoid the short circuit or the damage of any of the electronic components inside the internal space 14. However, the material, the shape and the arrangement of the sealing component of the present disclosure are not limited to this embodiment. It depends on practical demands.

It should be noticed that, in this embodiment, the two abutting components 132 are located at a middle portion 121 of the second assembling component 12. Therefore, only the middle portion 121 of the second assembling component 12 can be forced when each sliding component 133 forces the corresponding abutting component 132. In order to prevent that only a portion of the sealing component 131 adjacent to the middle portion 121 of the second assembling component is pressed to be resiliently deformed due to uneven force distribution, the electronic device 1 can further include two fastening components, e.g., screws, which are not shown in the figures. The two fastening components can pass through two fixing holes 122 formed on the second assembling component 12 to fix an upper side 123 of the second assembling component 12 adjacent to the display module onto the first assembling component 11 for ensuring a portion of the sealing component 131 adjacent to the upper side 123 of the second assembling component 12 to be pressed by the first assembling component 11 and the second assembling component 12 to be resiliently deformed.

However, the present disclosure is not limited to this embodiment. For example, in another embodiment, the waterproofing structure can include four sliding components and four abutting components. Furthermore, the four abutting components can be located at four corners of the sealing component, and the four sliding components can drive the second assembling component by the four abutting components to press the sealing component downwardly and evenly at the same time. In other words, in this embodiment, the fastening component can be omitted. Alternatively, in another embodiment, the waterproofing structure can include one abutting component, which can be formed in a rod shape, a C shape, a U shape or an enclosed shape, and one sliding component for driving the abutting component only. In addition, the numbers of the abutting component and the sliding component depend on practical demands. For example, in another embodiment, the waterproofing structure can include four abutting components and one sliding component for forcing the four abutting components at the same time. Alternatively, in another embodiment, the waterproofing structure can include one abutting component, which can be formed in an enclosed shape, and four sliding components for forcing four corners of the enclosed-shaped abutting component.

Besides, in this embodiment, in order to achieve sliding movement of each sliding component 133 relative to the first assembling component 11, the waterproofing structure 13 can further include two sliding plates 134. Two sliding slots 112 are formed on a first side of an upper wall 111 of the first assembling component 11 adjacent to the second assembling component 12. The two sliding plates 134 are slidably disposed inside the two sliding slots 112. Each sliding component 133 is disposed on a second side of the upper wall 111 of the first assembling component 11 opposite to the first side of the upper wall 111 by the corresponding sliding plate 134. Each sliding component 133 is slidable relative to the first assembling component 11 by sliding cooperation of the corresponding sliding plate 134 and the corresponding sliding slot 112, to force the corresponding abutting component 132.

Figure 7:
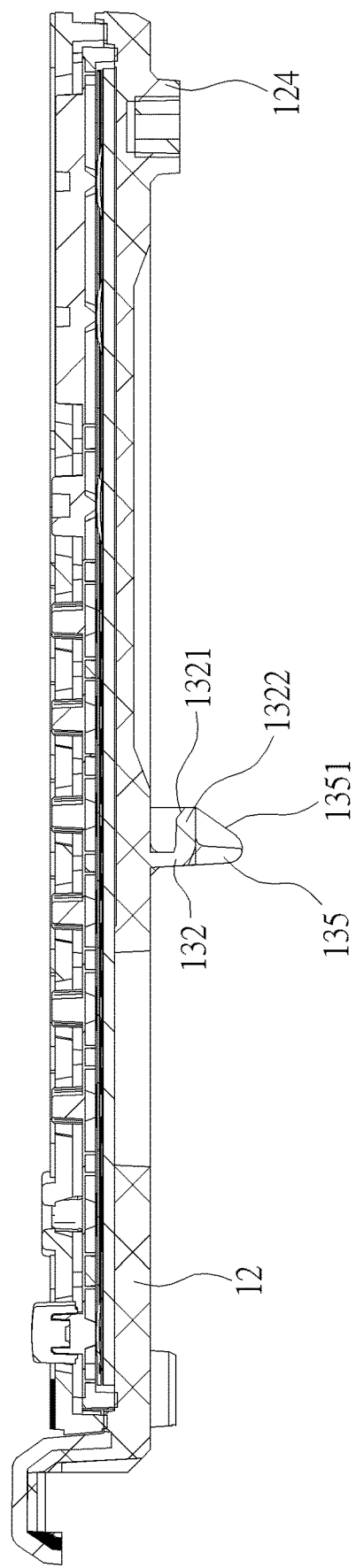
FIG. 7 is another partial internal structural diagram of the electronic device according to the embodiment of the present disclosure.
Figure 8:
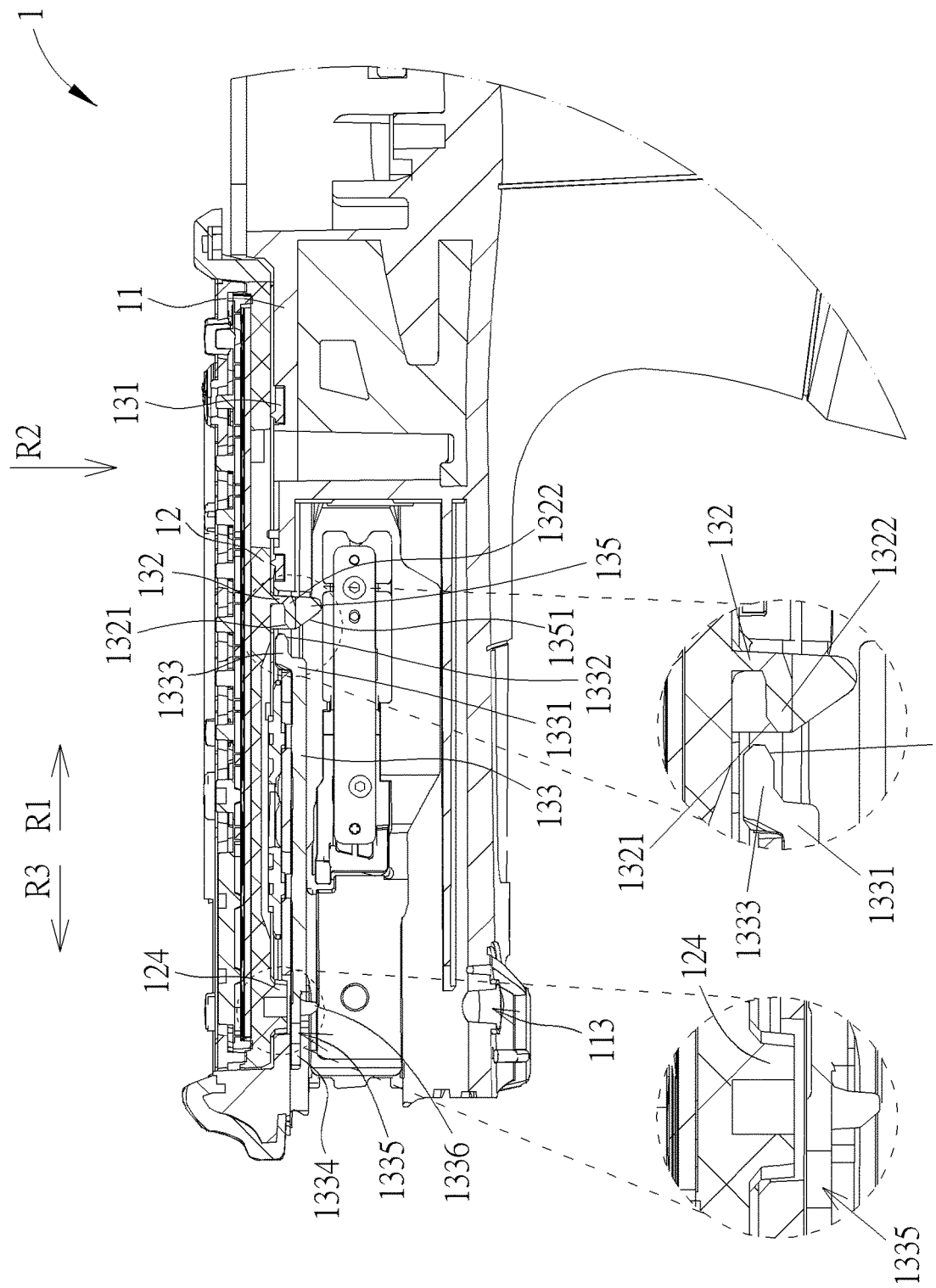
FIG. 8 to FIG. 10 are partial sectional diagrams of the electronic device in different states according to the embodiment of the present disclosure.
Figure 9:
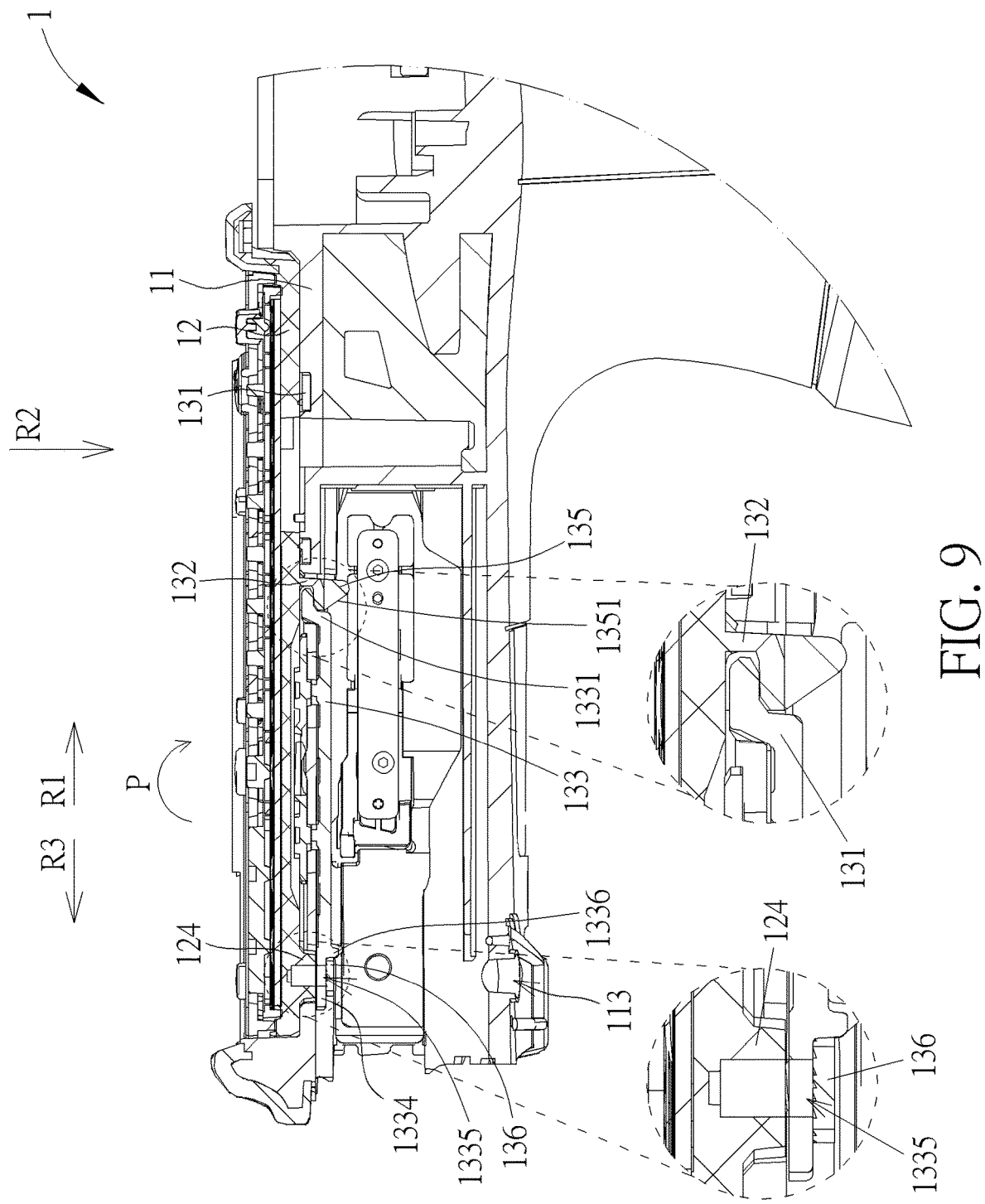
Figure 10:
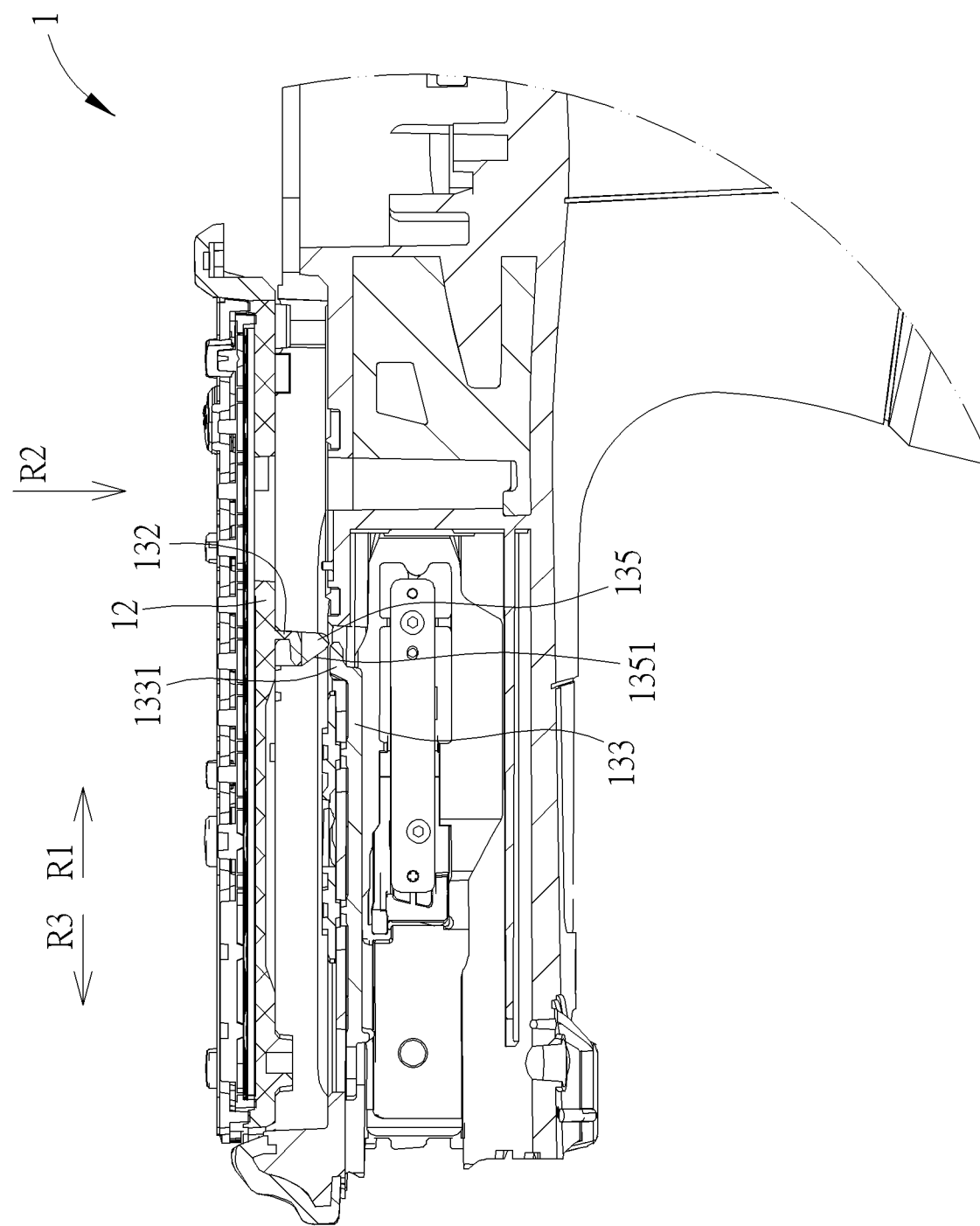

Please refer to FIG. 3 to FIG. 10. FIG. 7 is another partial internal structural diagram of the electronic device 1 according to the embodiment of the present disclosure. FIG. 8 to FIG. 10 are partial sectional diagrams of the electronic device 1 in different states according to the embodiment of the present disclosure. As shown in FIG. 3 to FIG. 10, a first abutting surface 1332 is formed on an engaging end 1331 of each sliding component 133 for abutting against the corresponding abutting component 132. A second abutting surface 1321 is formed on each abutting component 132. When each sliding component 133 slides relative to the first assembling component 11 along a first direction R1 to abut against the corresponding abutting component 132, the second assembling component 12 can be driven to move along a second direction R2 substantially perpendicular to the first direction R1 toward the first assembling component 11 by relative sliding movement of the corresponding first abutting surface 1332 and the corresponding second abutting surface 1321 generated by abutment cooperation of the corresponding first abutting surface 1332 and the corresponding second abutting surface 1321. Preferably, in this embodiment, the engaging end 1331 of each sliding component 133 can include a first engaging hook 1333, and the first abutting surface 1332 can be formed on the first engaging hook 1333. Furthermore, each abutting component 132 can include a second engaging hook 1322, and the second abutting surface 1321 can be formed on the second engaging hook 1322. Besides, preferably, in this embodiment, the first abutting surface 1332 and the second abutting surface 1321 can be inclined surfaces. However, the present disclosure is not limited to this embodiment.

Furthermore, as shown in FIG. 5, FIG. 7 and FIG. 10, the waterproofing structure 13 further includes two guiding protrusions 135. Each guiding protrusion 135 is disposed on the corresponding abutting component 132. Each guiding protrusion 135 includes a guiding inclined surface 1351 for abutting against the engaging end 1331 of the corresponding sliding component 133 to drive the corresponding sliding component 133 to slide along a third direction R3 opposite to the first direction R1 to leave away from a position as shown in FIG. 10, i.e., away from an installing path of the second assembling component 12, when the second assembling component 12 is installed on the first assembling component 11 along the second direction R2, which ensures the second assembling component 12 to be properly installed on the first assembling component 11 without interference by the sliding component 133.

Besides, as shown in FIG. 2 to FIG. 5 and FIG. 8 to FIG. 9, the waterproofing structure 13 further includes two fixing components 136. A through hole 1335 is formed on a fixing end 1334 of each sliding component 133 away from the corresponding abutting component 132 for allowing the corresponding fixing component 136 to pass through the through hole 1335. Two fixing portions 124 are formed on the second assembling component 12. When each sliding component 133 slides relative to the first assembling component 11 from a disengaging position as shown in FIG. 8 to reach an engaging position as shown in FIG. 9, each through hole 1335 is aligned with the corresponding fixing portion 124. At this moment, each fixing component 136 is allowed to pass through the corresponding through hole 1335 to fix the fixing end 1334 of the corresponding sliding component 133 onto the corresponding fixing portion 124. During a process that each fixing component 136 passes through the corresponding through hole 1335 to fix the fixing end 1334 of the corresponding sliding component 133 onto the corresponding fixing portion 124 formed on the second assembling component 12, each sliding component 133 is driven to pivot along a pivoting direction P by the corresponding fixing component 136, so that the engaging end 1331 of each sliding component 133 abutting against the corresponding abutting component 132 moves toward the first assembling component 11 along the second direction R2, and the second assembling component 12 moves toward the first assembling component 11 along the second direction R2, which causes to press the sealing component 131 to be pressed by the first assembling component 11 and the second assembling component 12 more tightly.

In addition, as shown in FIG. 2, FIG. 5 and FIG. 8 to FIG. 9, in order to enhance operability of the sliding component 133, an operating portion 1336 is formed each sliding component 133 for allowing the user to operate to drive each sliding component 133 to slide. In this embodiment, the operating portion 1336 can preferably be a protruding structure located adjacent to the fixing end 1334. However, the present disclosure is not limited to this embodiment. It depends on practical demands.

Furthermore, as shown in FIG. 8 and FIG. 9, two inserting portions 113 are formed on the first assembling component 11. Each inserting portion 113 is located at a position corresponding to the fixing end 1334 of the corresponding sliding component 133 and the corresponding fixing portion 124. Specifically, each inserting portion 113 is located at position corresponding to the corresponding operating portion 1336 and the corresponding through hole 1335. In this embodiment, the inserting portion 113 can preferably be a hole for allowing the user to insert a tool, such as a screw driver, through the inserting portion 113 to operate the operating portion 1336 or fixing the fixing end 1334 of the sliding component 133 onto the fixing portion 124 with the fixing component 136.

Operational principle of the present disclosure is provided as follows. When it is desired to assemble the electronic device 1, the user can use the tool to push the operating portion 1336 of each sliding component 133 to drive each sliding component 133 to slide along the third direction R3 to the disengaging position as shown in FIG. 8. Afterwards, the second assembling component 12 can be installed on the first assembling component 11 along the second direction R2, and the upper side 123 of the second assembling component 12 can be fixed onto the first assembling component 11 by two fastening components, which are not shown in the figures. At this moment, the portion of the sealing component 131 adjacent to the upper side 123 of the second assembling component 12 can be pressed tightly by the first assembling component 11 and the upper side 123 of the second assembling component 12 to be resiliently deformed. However, a portion of the sealing component 131 away from the upper side 123 of the second assembling component 12, i.e., the portion of the sealing component 131 adjacent to the middle portion 121 of the second assembling component 12, has been not pressed tightly by the first assembling component 11 and the middle portion 121 of the second assembling component 12 yet.

Then, the user can use the tool to push the operating portion 1336 of each sliding component 133 to drive each sliding component 133 to slide along the first direction R1 from the disengaging position as shown in FIG. 8 to the engaging position as shown in FIG. 9. During sliding movement of the sliding component 133 to the engaging position, the second assembling component 12 can be driven to move along the second direction R2 toward the first assembling component 11 by relative sliding movement of the corresponding first abutting surface 1332 and the corresponding second abutting surface 1321 generated by abutment cooperation of the corresponding first abutting surface 1332 and the corresponding second abutting surface 1321, so that the portion of the sealing component 131 adjacent to the middle portion 121 of the second assembling component 12 can be pressed tightly by the first assembling component 11 and the middle portion 121 of the second assembling component 12 to be resiliently deformed.

When each sliding component 133 is located at the engaging position as shown in FIG. 9, the user can insert the tool through the corresponding inserting portion 113 and use the tool to fix the fixing end 1334 of the corresponding sliding component 133 onto the corresponding fixing portion 124 by the corresponding fixing component 136, so as to drive the second assembling component 12 to move toward the first assembling component 11 along the second direction R2, so that the portion of the sealing component 131 adjacent to the middle portion 121 of the second assembling component 12 can be pressed by the first assembling component 11 and the middle portion 121 of the second assembling component 12 more tightly. By such mechanism, the whole sealing component 131 disposed between the first assembling component 11 and the second assembling component 12 can be pressed tightly by the first assembling component 11 and the second assembling component 12 to be resiliently deformed for blocking the liquid outside the waterproofing area 15 enclosed by the sealing component 131 to prevent the liquid from entering the internal space 14 where the electronic components are disposed.

On the other hand, when it is desired to detach the second assembling component 12 from the first assembling component 11, the user can insert the tool through the corresponding inserting portion 113 and use the tool to detach the fixing components 136 and then push the operating portion 1336 of each sliding component 133 to drive each sliding component 133 to slide from the engaging position as shown in FIG. 9 to the disengaging position as shown in FIG. 8. Afterwards, the user can use the tool to detach the fastening components, which are fixed on the upper side 123 of the second assembling component 12 and not shown in the figures, to allow detachment of the second assembling component 12 from the first assembling component 11.

During the aforementioned installation and detachment processes, it only has to use the same one tool, i.e., the screw driver, to complete the operation. Therefore, the present disclosure has an advantage of easy use.

In contrast to the prior art, the present disclosure utilizes relative sliding movement of the first abutting surface formed on the sliding component and the second abutting surface formed on the abutting component to drive the second assembling component to move toward the first assembling component, so that the sealing component disposed between the first assembling component and the second assembling component can be pressed by the first assembling component and the second assembling component to be resiliently deformed, which achieves a purpose of blocking liquid outside the waterproofing area enclosed by the sealing component to prevent the liquid from entering into an internal space where electronic components are disposed. Such mechanism does not require a screw boss and a through hole acknowledged in the prior art. Therefore, the electronic device of the present disclosure has thinner thickness and an improved external appearance.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A waterproofing structure disposed between a first assembling component and a second assembling component of an electronic device, the second assembling component being detachably installed on the first assembling component, the waterproofing structure comprising:
   a sealing component located between the first assembling component and the second assembling component;
   at least one abutting component fixed on the second assembling component; and
   at least one sliding component installed on the first assembling component, the at least one sliding component being slidable relative to the first assembling component along a first direction and not slidable relative to the first assembling component along a second direction different from the first direction, a first abutting surface being formed on an engaging end of the at least one sliding component for abutting against the at least one abutting component, a second abutting surface being formed on the at least one abutting component, the first abutting surface and the second abutting surfaces being inclined surfaces respectively, when the at least one sliding component slides along the first direction, the first abutting surface abutting against the second abutting surface to drive the second assembling component to move toward the first assembling component along the second direction, so that the sealing component is pressed by the first assembling component and the second assembling component.

2. The waterproofing structure of claim 1, further comprising at least one fixing component, at least one through hole being formed on a fixing end of the at least one sliding component away from the at least one abutting component for allowing the at least one fixing component to pass through the at least one through hole, the at least one through hole being aligned with at least one fixing portion formed on the second assembling component when the at least one sliding component is located at an engaging position, and the at least one fixing component passing through the at least one through hole to fix the fixing end of the at least one sliding component onto the at least one fixing portion formed on the second assembling component when the at least one sliding component is located at the engaging position.

3. The waterproofing structure of claim 1, further comprising at least one fixing component, at least one through hole being formed on a fixing end of the at least one sliding component away from the at least one abutting component for allowing the at least one fixing component to pass through the at least one through hole, and an engaging end of the at least one sliding component abutting against the at least one abutting component moving toward the first assembling component during a process that the at least one fixing component passes through the at least one through hole to fix the fixing end of the at least one sliding component onto the at least one fixing portion formed on the second assembling component.

4. The waterproofing structure of claim 1, wherein an operating portion protrudes from the at least one sliding component, and an inserting portion is formed on the first assembling component and located at a position corresponding to the operating portion.

5. The waterproofing structure of claim 1, wherein the engaging end of the at least one sliding component comprises a first engaging hook, the first abutting surface is formed on the first engaging hook, the at least one abutting component comprises a second engaging hook, the second abutting surface is formed on the second engaging hook, and the second direction is substantially perpendicular to the first direction.

6. The waterproofing structure of claim 1, further comprising at least one guiding protrusion disposed on the at least one abutting component, and the at least one guiding protrusion comprising a guiding inclined surface for driving the at least one sliding component to move along a third direction substantially opposite to the first direction.

7. The waterproofing structure of claim 1, wherein the sealing component is formed in an enclosed structure and made of resilient material, a waterproofing area is enclosed by the sealing component, and the at least one abutting component is located at a position corresponding to the sealing component and outside the waterproofing area.

8. The waterproofing structure of claim 7, wherein the at least one abutting component comprises a plurality of abutting components, the plurality of abutting components are disposed outside and around the waterproofing area, and when the at least one sliding component slides along the first direction, the at least one sliding component forces the plurality of abutting components to drive the second assembling component to move toward the first assembling component, so that the sealing component is pressed by the first assembling component and the second assembling component.

9. The waterproofing structure of claim 8, wherein the at least one sliding component comprises a plurality of sliding components corresponding to the plurality of abutting components, and when each of the plurality of sliding components slides along the first direction, each of the plurality of sliding components forces a corresponding one of the plurality of abutting components to drive the second assembling component to move toward the first assembling component, so that the sealing component is pressed by the first assembling component and the second assembling component.

10. An electronic device with waterproofing function comprising:
a first assembling component;
a second assembling component detachably installed on the first assembling component; and
a waterproofing structure disposed between the first assembling component and the second assembling component, the waterproofing structure comprising:
a sealing component located between the first assembling component and the second assembling component;
at least one abutting component fixed on the second assembling component; and
at least one sliding component installed on the first assembling component, the at least one sliding component being slidable relative to the first assembling component along a first direction and not slidable relative to the first assembling component along a second direction different from the first direction, a first abutting surface being formed on an engaging end of the at least one sliding component for abutting against the at least one abutting component, a second abutting surface being formed on the at least one abutting component, the first abutting surface and the second abutting surfaces being inclined surfaces respectively, when the at least one sliding component slides along the first direction, the first abutting surface abutting against the second abutting surface to drive the second assembling component to move toward the first assembling component along the second direction, so that the sealing component is pressed by the first assembling component and the second assembling component.

11. The electronic device of claim 10, wherein the waterproofing structure further comprises at least one fixing component, at least one through hole is formed on a fixing end of the at least one sliding component away from the at least one abutting component for allowing the at least one fixing component to pass through the at least one through hole, the at least one through hole is aligned with at least one fixing portion formed on the second assembling component when the at least one sliding component is located at an engaging position, and the at least one fixing component passes through the at least one through hole to fix the fixing end of the at least one sliding component onto the at least one fixing portion formed on the second assembling component when the at least one sliding component is located at the engaging position.

12. The electronic device of claim 10, wherein the waterproofing structure further comprises at least one fixing component, at least one through hole is formed on a fixing end of the at least one sliding component away from the at least one abutting component for allowing the at least one fixing component to pass through the at least one through hole, and an engaging end of the at least one sliding component abutting against the at least one abutting component moves toward the first assembling component during a process that the at least one fixing component passes through the at least one through hole to fix the fixing end of the at least one sliding component onto the at least one fixing portion formed on the second assembling component.

13. The electronic device of claim 10, wherein an operating portion protrudes from the at least one sliding component, and an inserting portion is formed on the first assembling component and located at a position corresponding to the operating portion.

14. The electronic device of claim 10, wherein the engaging end of the at least one sliding component comprises a first engaging hook, the first abutting surface is formed on the first engaging hook, the at least one abutting component comprises a second engaging hook, the second abutting surface is formed on the second engaging hook, and the second direction is substantially perpendicular to the first direction.

15. The electronic device of claim 10, wherein the waterproofing structure further comprises at least one guiding protrusion disposed on the at least one abutting component, and the at least one guiding protrusion comprises a guiding inclined surface for driving the at least one sliding component to move along a third direction substantially opposite to the first direction.

16. The electronic device of claim 10, wherein the sealing component is formed in an enclosed structure and made of resilient material, a waterproofing area is enclosed by the sealing component, and the at least one abutting component is located at a position corresponding to the sealing component and outside the waterproofing area.

17. The electronic device of claim 16, wherein the at least one abutting component comprises a plurality of abutting components, the plurality of abutting components are disposed outside and around the waterproofing area, and when the at least one sliding component slides along the first direction, the at least one sliding component forces the plurality of abutting components to drive the second assembling component to move toward the first assembling component, so that the sealing component is pressed by the first assembling component and the second assembling component.

18. The electronic device of claim 17, wherein the at least one sliding component comprises a plurality of sliding components corresponding to the plurality of abutting components, and when each of the plurality of sliding components slides along the first direction, each of the plurality of sliding components forces a corresponding one of the plurality of abutting components to drive the second assembling component to move toward the first assembling component, so that the sealing component is pressed by the first assembling component and the second assembling component.

* * * * *